United States Patent [19]
Bruno

[11] Patent Number: 5,631,768
[45] Date of Patent: May 20, 1997

[54] TECHNICAL FIELD OF OPTOELECTRONICS

[75] Inventor: Adrien Bruno, Palaiseau, France

[73] Assignee: France Telecom, France

[21] Appl. No.: 532,174

[22] Filed: Sep. 22, 1995

[30] Foreign Application Priority Data

Sep. 23, 1994 [FR] France ................. 94 11369

[51] Int. Cl.$^6$ ................. H01S 3/00; G02B 6/12
[52] U.S. Cl. ............ 359/333; 359/124; 359/127; 385/14
[58] Field of Search ................. 359/344, 333, 359/127, 124, 130, 131, 193, 195; 385/14

[56] References Cited

U.S. PATENT DOCUMENTS

| | | | |
|---|---|---|---|
| 5,064,263 | 11/1991 | Stein | 385/14 |
| 5,394,489 | 2/1995 | Koch | 385/14 |
| 5,414,548 | 5/1995 | Tachikawa et al. | 359/130 |
| 5,440,416 | 8/1995 | Cohen et al. | 359/127 |
| 5,450,431 | 9/1995 | Glance et al. | 372/50 |

FOREIGN PATENT DOCUMENTS

| | | | |
|---|---|---|---|
| 0422854 | 10/1990 | European Pat. Off. | G02B 6/12 |
| 0561672 | 3/1993 | European Pat. Off. | H01S 3/06 |

OTHER PUBLICATIONS

Electronics Letters, vol. 29, No. 4, Feb. 18, 1993, Stevenage, pp. 326–328.

ECOC'93, Montreux, Suise, Sep. 12–16 1993, vol. 3., M.R. Amersfoort et al., High Performance Phasar Wavelengeth Demultiplexer Integrated With Photodetectors, pp. 49–52.

B.H. Verbeek et al., Large Bandwidth Polarisation Independent and Compact 8 Channel Phasar Demultiplexer/Filter, pp. 63–66.

High Performance 4–channel Phasar Wavelength Demultiplexer Integrated With Photodetectors, pp. 49–52.

Applied Physics Letters, vol. 59, No. 6, Aug. 5, 1991, Grating Spectrograph In InGaAsP/InP For Dense Wavelength Division Multiplexing, pp. 627–629.

IEEE Photonics Technology Letters, vol. 6, No. 4, Apr. 1994, New York US, pp. 516–518.

*Primary Examiner*—Mark Hellner
*Attorney, Agent, or Firm*—Blakely Sokoloff Taylor & Zafman

[57] ABSTRACT

This invention concerns an optoelectronic device, characterized in that it comprises, integrated by deposition in a single epitaxy on a semi-insulating substrate: at least one mode adapter (T), at least one optical amplifier (OA), at least one filter (MUX) capable of separating different wavelengths of the signal, at least one photodetector (D) and at least one guide (G) ensuring the link between the above-mentioned elements.

38 Claims, 9 Drawing Sheets

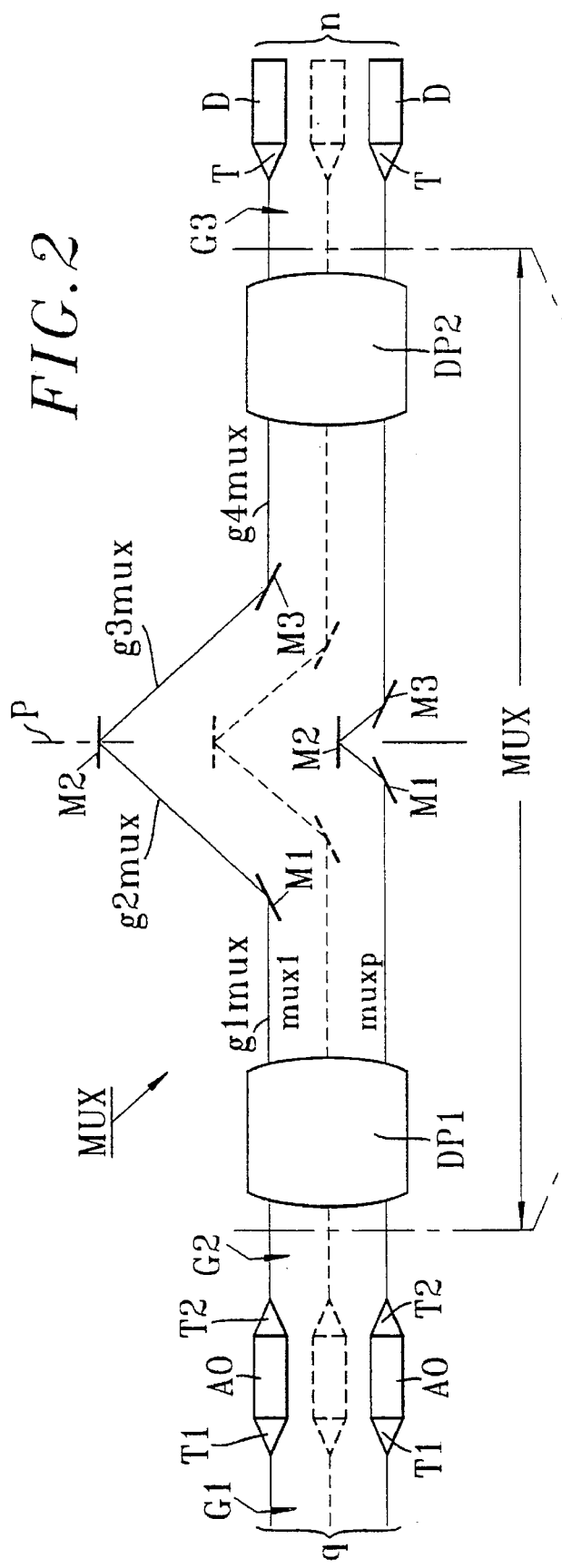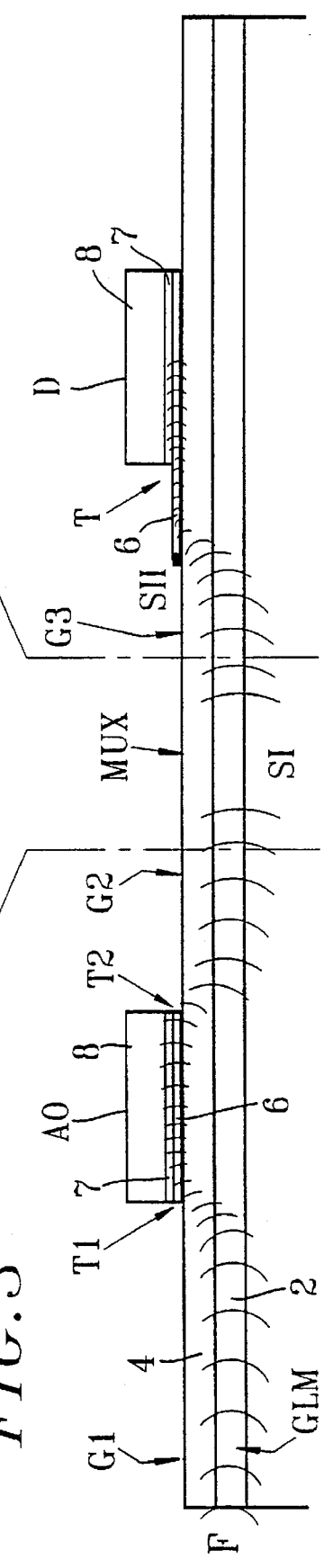

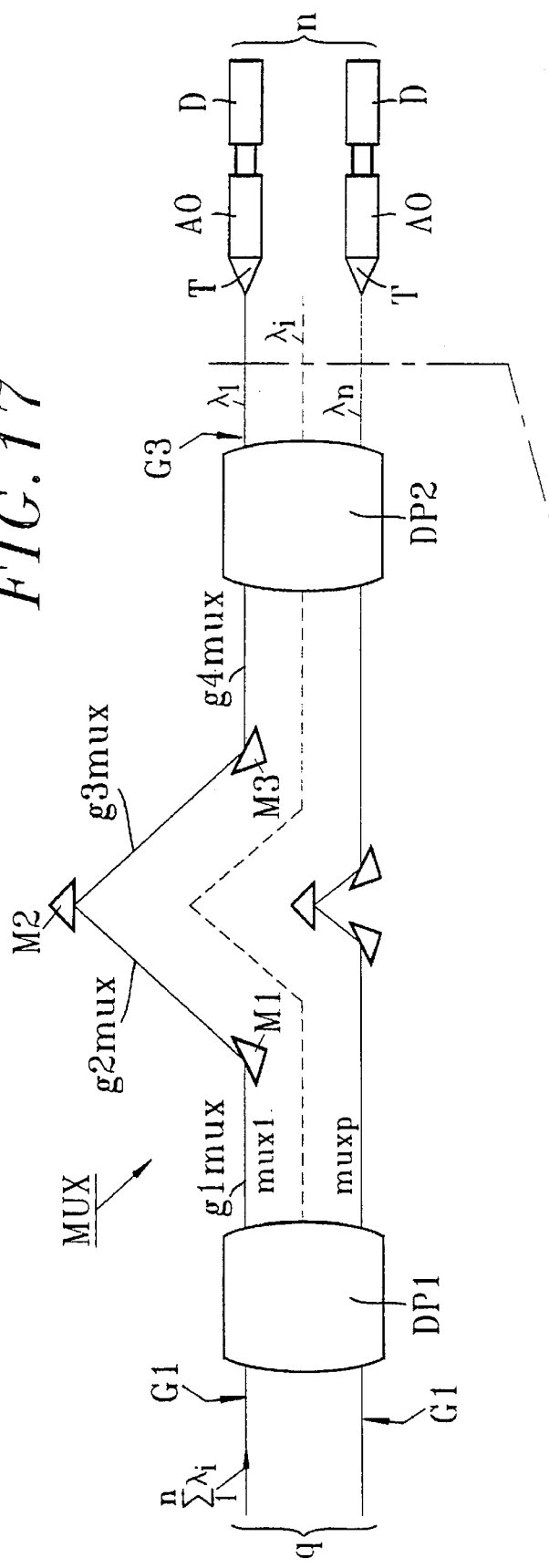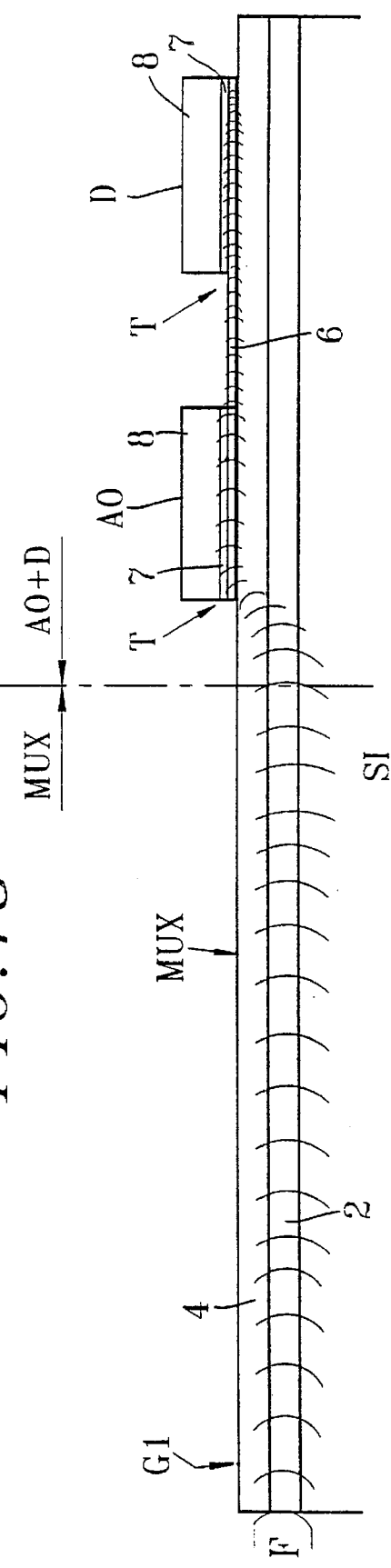

λ SEPARATOR OUTPUT

TECHNICAL FIELD OF OPTOELECTRONICS

This invention concerns the technical field of optoelectronics, i.e. the field of semiconductor devices joining optical circuits and electronic circuits on the same material.

The present invention may be applied particularly in the field of telecommunications and of sensors in telemetry. The device according to the invention may be used as an optical receiver of a direct-detection receiving circuit, for example for optical link systems. This device makes it possible to separate signals of different wavelengths, for example signals of different wavelengths arriving from a same fiber, towards different users, each receiving its own wavelength. The device according to the invention may also be used in optical interconnections between, for example, high-integration fast electronic micro-chips or between computers, or again inside computers.

Numerous sub-assemblies for optoelectronic devices have already been proposed.

For example, Optical Amplifiers (OA) have been proposed with the purpose of amplifying a received signal. An optical amplifier structure is described, particularly in the document by R. Dall'ara et al., European Conference on Optical Communication, p. 393, 1994, "Polarization Insensitive Multifunctional Monolithically Integrated Optical Amplifier/Photodetector". This document describes an optical amplifier obtained by etching a strip in a semiconductor structure.

Several multi-wavelength filters have also been proposed. More specifically, two types of structures have been proposed, allowing the spatial separation in wavelength of a same input beam: the vertical grating spectrograph and the waveguide grating spectrograph.

The former uses a standard but vertical etched grating. The latter uses two planar diopters separated by a guide beam of different lengths, at constant pitch. The phase shift induced by the difference of length separates in wavelength at the output of the second diopter.

A vertical grating spectrograph-type structure is described in the document by C. Cremer et al. (Siemens) "Grating spectrograph in InGaAsP/InP for dense wavelength division multiplexing", APL 59(6), May 8, 1991, p. 627.

Waveguide grating spectrograph-type structures are described in documents by 1) B. H. Verbeek et al. "Large Bandwidth Polarization Independent and Compact/8 Channel PHASAR Demultiplexer/Filter", OFC94, PD 13-1, and 2) M. Zirngibl et al. (AT&T) "Polarization independent 8×8 waveguide grating multiplexer on InP", Elec. Lett. 21/01/93, vol. 29, No. 2, p. 201.

The device described in the document by Verbeek possesses 8 inputs and 8 outputs. It is polarization independent (TE, TM) by virtue of a very low birefringence. It is $2.6 \times 2.3 mm^2$ in size. It is fabricated with several curvature radii.

In the document by Zirngibl, polarization independence is achieved by using different orders between the TE and TM modes, since the weak birefringence which exists for this type of guide is insufficient to obtain polarization independence when working with the same order in TE and TM modes.

The document by M. R. Amersfoort et al. (Delft University) "High Performance 4-channel PHASAR Wavelength Demultiplixer Integrated with Photodetectors", ECOC 93, p. 49, has given an outline of an integration of filter and photodetector. The device obtained is $3 \times 2.3$ mm² in size. The dimensions of the diodes are $150 \times 80$ µm².

SUMMARY OF THE INVENTION

This invention now aims at perfecting the existing optoelectronic devices.

The invention notably aims, with regard to reception, at allowing wavelength demultiplexing through the use of an optoelectronic device integrated on a semi-insulating substrate.

More specifically, the invention aims at optimizing the following parameters in a direct-detection receiver: size, insertion losses, internal losses, polarization independence, photodetector speed, separation between canals and the number of canals.

According to the present invention, these objectives are achieved by means of an optoelectronic device characterized in that it comprises, integrated by deposition in a single epitaxy, on a semi-insulating substrate: at least one mode adapter, at least one optical amplifier, at least one filter capable of separating different wavelengths of the signal, at least one photodetector, and at least one guide ensuring an optical link between the above-mentioned elements.

According to another advantageous characteristic of this invention, the wavelength separator filter comprises at least one mirror.

According to another advantageous characteristic of this invention, the wavelength separator filter comprises at least two diopters, a series of optical guides placed between the diopters and facing the mirrors, in such a way that the optical guides present different lengths between the diopters.

According to another advantageous characteristic of this invention, the mode adapter is formed by glass-shaped etching.

According to another advantageous characteristic of this invention, at least one optical amplifier is provided after the wavelength separator filter, associated with a specific photodetector.

According to another advantageous characteristic of this invention, the optical guide ensuring the liaison between the different elements of the optoelectronic device is a wide-mode guide.

This preferential characteristic of the invention for permitting the integration of the different constitutive elements of the optoelectronic device (mode adapter, optical amplifier, wavelength separator filter and photodetector), together with the optical guides which ensure their liaison by embodying these elements and the guide in the same material, is at odds with the current state of technical knowledge.

In this connection, the integration of a filter and photodetectors outlined in the document by Amersfoot et al. is noteworthy. In fact, in order to allow lengths of weak absorption (150µm), the authors recommend the use of a small-mode guide (guide layer=0.6µm).

For the integration of an optical amplifier the reasoning is the same as with that applied by Amersfoort for the detector: there must be substantial covering of the guided mode by the amplifier layer or the detector layer. Wide-mode guides provide less substantial covering and this explains the tendency, in the current state of technical knowledge, to integrate weak-mode separator filters.

Other characteristics, objectives and advantages of this invention will become apparent on reading the following detailed description, and in the light of the accompanying drawings given as non-limitative examples in which:

BRIEF DESCRIPTION OF THE DRAWINGS

FIG. 2 represents an overhead view of an integrated structure with three mirrors on each optical path, at the level of the separator filter, FIG. 3 represents a sectional view of the integrated structure illustrated in FIG. 2, FIG. 17 represents an overhead view of a variant, according to the invention, of an integrated structure with mirrors comprising an optical amplifier placed between the wavelength separator filter forming a multiplexer and each photodetector, FIG. 18 represents a sectional view of the same device.

DESCRIPTION OF THE PREFERRED EMBODIMENTS

Figure 1:
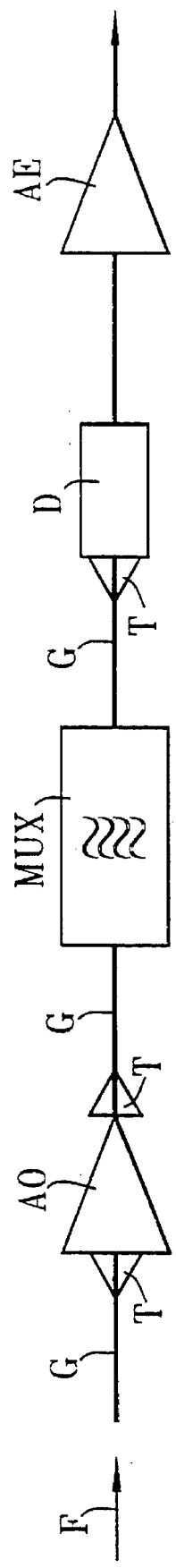
FIG. 1 represents the functional diagram of a direct-detection optoelectronic system according to the invention.

FIG. 1, hereto attached, represents the general structure of an optoelectronic device according to the invention comprising an optical amplifier OA, a wavelength separator filter MUX, and a photodetector D.

In addition, the optoelectronic device according to the invention comprises at least one T-mode adapter, more specifically a T-mode adapter upstream and respectively downstream of the optical amplifier OA and T-mode adapter upstream of each photodetector D, according to the embodiment of FIGS. 2 to 16, and a T-mode adapter upstream of each optical amplifier OA, according to the embodiment of FIGS. 17 to 21.

The various above-mentioned elements T, OA, MUX and D are connected by an optical guide marked G, advantageously a wide-mode guide.

Moreover, FIG. 1 schematically represents an optical fiber, marked F, carrying the input signal on the optoelectronic device.

The purpose of the T-mode adapters is to allow coupling with the input fiber F and with the weak-mode components OA and D, by making possible transfer from the wide mode of the guide G to a weak mode compatible with these components.

The function of the optical amplifier OA is to amplify optically the received signal.

The function of the separator filter MUX is to separate the different wavelengths of the signal and to reduce the noise of the optical amplifier.

The function of the photodetector D is to detect the received signal for each wavelength.

The photodetector D is preferably linked to an electric amplifier (EA). As the latter may be a standard electric amplifier, no detailed description of its structure will be given.

The structure of the optoelectronic device represented on the accompanying FIGS. 2 and 3 will now be described.

The device represented on FIGS. 2 and 3 comprises an optical waveguide input section G1 connected to an optical amplifier OA by means of an input mode adapter T1. This optical amplifier OA is coupled by means of a second output mode adapter T2 and a second optical guide output section T2 to the wavelength separator filter MUX.

These two mode adapters T1 and T2, respectively input and output, are symmetrical. The input adapter T1 transfers the wide mode of the guide G1 to a weak mode compatible with the optical amplifier OA. In contrast, the output adapter T2 transfers the weak mode of the optical amplifier OA to a wide mode compatible with the guide G2.

According to the embodiment represented in FIGS. 2 and 3, considered as preferential in the context of the invention, the wavelength separator filter MUX comprises a planar input diopter DP1, a planar output diopter DP2 and a network of mirror waveguides placed between diopters DP1 and DP2 in order to define optical paths of different lengths between the two diopters.

In FIG. 2, the different channels of the network of mirror waveguides placed between diopters DP1 and DP2 are marked mux1 to muxp.

More specifically, according to the particular embodiment represented in FIG. 2, each channel mux1 to muxp of the network of mirror waveguides comprises four rectilinear waveguide sections g1mux, g2mux, g3mux, g4mux and three mirrors M1, M2, M3.

The guide sections g1mux to g4mux have different lengths from one channel to another.

The two end guide sections of each channel, marked g1mux and g4mux, are preferably aligned and parallel to the above-mentioned guides G1 and G2.

In contrast, the two intermediate sections g2mux and g3mux are inclined in relation to the end sections g1mux and g4mux. The waveguide sections g1mux, g2mux, g3mux, g4mux and the mirrors M1, M2, M3 constituting the separator filter MUX may present a principal plane P perpendicular to the input sections G1, G2 of the optical guide.

The output diopter DP2 combines the signals arriving from the different channels mux1 to muxp, dephased because of the different length of the path traveled.

The planar diopters DP1 and DP2 correspond to non-laterally guided zones, i.e. to planar guidance zones. The structure of the planar diopters is the same as for those of wide-mode guides. The planar diopter and guide assembly may thus be fabricated at the same time. Their function is identical to that of a standard lens. The lens output image is calculated by Fourier transform. This makes it possible to obtain a wavelength spatial separation as a result of a difference in length of the guides between the two diopters DP1 and DP2.

The output diopter DP2 is then coupled by means of at least one optical guide section G3 and by means of a T-mode adapter to at least one photodetector D.

This photodetector D thus delivers an electric signal corresponding to the signal of a specific wavelength separated at output from the filter MUX, to the electric amplifier EA, or to any other appropriate treatment organ.

More specifically and preferably, n channels, with n being more than 1, are provided at the output of the diopter DP2, each of these channels comprising an optical guide section G3 coupled by means of a T-mode adapter to a specific photodetector D. In this way, each photodetector D delivers a signal representative of a specific associated wavelength.

In FIG. 3, the semi-insulating substrate carrying the optoelectronic device is marked SI.

In the same FIG. 3, the propagation direction of the optical wave in the device is represented schematically by curved lines.

In the same FIG. 3, the wide-mode guide G1, placed upstream of the optical amplifier OA in order to facilitate coupling with the input fiber F, is marked GLM. Lastly, in FIG. 3, a single heterostructure guide comprising the T-mode adapter at input of the photodetector D, is marked SH.

It will be noted that the first mirror M1 is situated at the level of the junction between the optical guide sections g1mux and g2mux, and that the second mirror M2 is situated at the level of the junction between the optical guide sections g2mux and g3mux, whereas the third mirror M3 is situated at the level of the junction between the optical guide sections g3mux and g4mux.

The function of mirrors M1 to M3 is to send the signal received from the upstream guide section to the downstream guide section.

Figure 4:
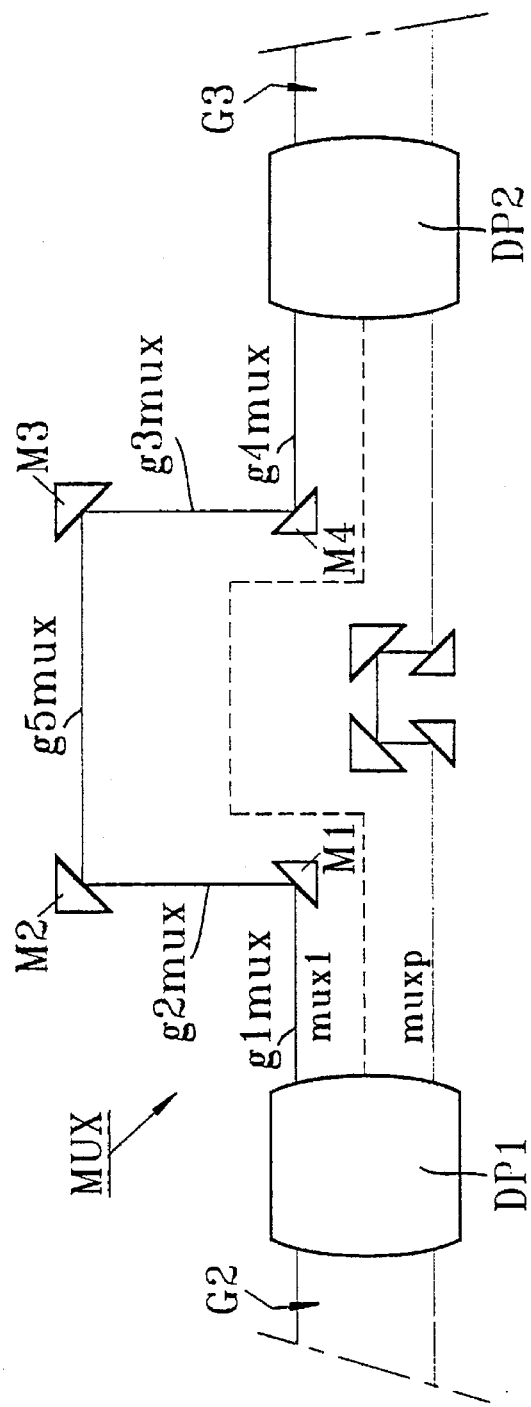
FIG. 4 represents a variant, seen from above, of an integrated structure with four mirrors on each optical path at the level of the separator filter, according to the invention.

In an alternative embodiment according to the invention, FIG. 4 represents the separator filter MUX, no longer comprising four optical guide sections and three mirrors as illustrated in FIG. 2, but five optical guide sections g1mux, g2mux, g3mux, g4mux and g5mux, and four associated mirrors M1, M2, M3 and M4, for each channel mux1 to muxp placed between the diopters DP1 and DP2. This five-section and four-mirror structure makes it possible to optimize the difference of length between the different channels mux1 to muxp, between diopters DP1 and DP2.

Even more specifically, according to a non-limitative embodiment represented in FIG. 4, the two end sections g1mux and g4mux of each channel mux1 to muxp are preferably aligned and parallel to the input guides G1 and G2, the two sections g2mux and g3mux which are respectively linked to them extend perpendicularly to these end sections g1mux and g4mux, and lastly the additional section g5mux which ensures the liaison between sections g2mux and g3mux is preferably parallel to sections g1mux and g4mux.

Mirror M1 is placed at the level of the junction between g1mux and g2mux. Mirror M2 is placed at the level of the liaison between g2mux and g5mux. Mirror M3 is placed at the level of the junction between sections g5mux and g3mux. Lastly, mirror M4 is placed at the level of the junction between sections g3mux and g4mux.

Here again, the waveguide sections g1mux to g5mux have different lengths from one channel to another. Moreover, the function of mirrors M1 to M4 is to send the signal received from the upstream section towards the downstream section.

A preferential embodiment of the optoelectronic device schematically represented in FIGS. 2 and 3 will now be specified compared with FIGS. 5 to 16.

This device is obtained by depositing the nine layers of semiconductor material indicated in Table 1 on a semi-insulating substrate by means of a single epitaxy.

TABLE 1

|  | LAYERS | MATERIAL | THICKNESS (μm) | TYPE | INTER (μm) | CARRIERS (cm−3) |
|---|---|---|---|---|---|---|
| diode | 9 | GaInAs | 0.0500 | p+ |  | >5 × $10^{18}$ |
|  | 8 | InP | 0.8 | p+ |  | >5 × $10^{18}$ |
|  | 7 | GaInAsP | 0.3 | n− | 1.6 | <5 × $10^{15}$ |
| guide | 6 | GaInAsP | 0.35 | n− | 1.3 | <5 × $10^{15}$ |
|  | 5 | InP | 0.4 | n+ |  | >5 × $10^{18}$ |
| adap- | 4 | InP | 0.6 | n− |  | <5 × $10^{15}$ |
| ter | 3 | InGaAsP | 0.13 | n− |  | <5 × $10^{15}$ |
| guide | 2 | InP | 1 | n− |  | <5 × $10^{15}$ |
|  | 1 | InGaAsP | 0.13 | n− |  | <5 × $10^{15}$ |
| Substrate |  | SI InP | 2" (100) | SI |  |  |

These different layers allowing the integration of the optoelectronic assembly are deposited in a single epitaxy on the semi-insulating substrate. The first four epitaxied layers constitute the layers of diluted-structure wide-mode guide. This structure possesses a weak birefringence which facilitates polarization independence.

The next two layers (layers 5 and 6) constitute a single heterostructure allowing the transition from wide mode to narrow mode and vice versa.

Layer 7, quaternary doped n, is placed above the guide making possible the contact of the photodetector D and the optical amplifier OA.

Finally, the last two layers 8 and 9, constituted of doped p binary and quaternary material allow both amplification and detection by electric polarization inversion.

T-mode adapters may be applied in different embodiments.

Thus, the wide-to-narrow mode coupling (and inversely) may be obtained by beveling a guiding layer, in steps or directly, or else by sharpening the guiding layer, for example by means of one or two lithographs or attacks. As a variant, and in order to avoid the use of exposure on wafers, which is extremely restrictive, while the guiding layer is being reduced to a point, it may be decided, instead of sharpening the guiding layer, to use total etching by zone, at variable pitches, of a strip composing this guiding layer, as described in the patent application filed under No. 94 05304 in France on 2nd May 1994. The expression "variable pitches" is understood to mean that the etched, (i.e. totally eliminated) zones have progressively increasing thickness moving away from the strip forming the guiding layer, and moreover that the discrete elements of this guiding layer preserved between two etched zones, have, conversely, progressively smaller thickness moving away from the strip forming the guiding layer.

However, according to the preferred embodiment of the invention, each T-mode adapter presents a glass-shaped form comprising a wide-mode input part, a zone of decreasing width to push the mode in depth and a zone of increasing width allowing mode transfer from wide the mode towards a weak mode (the symmetrical arrangement being used, by contrast, to operate the transfer of a weak mode from, for example, an optical amplifier towards a wide-mode guide).

In the decreasing zone, the strip forming the mode adapter decreases in width in the sense of the propagation of the optical signal.

The transition area between the decreasing zone and the increasing zone is not formed by a point (starting by definition at zero μm) but by a truncated point, starting for example with a width of the order of 2μm. Such a truncated extremity is easier to fabricate than a pure point or a point of narrow width (1μm).

The fabrication of the glass-shaped mode adapter is thus of particular importance in that it facilitates the technology. For example, it makes it possible to use an inexpensive optical lithography technique.

As shown schematically in FIG. 3, the mode is in its deepest position when it reaches the narrowest groove of the glass shape. At this level the guided-mode wide—mode transition is obtained.

Next comes the growth zone where the width of the strip increases in the sense of the optical propagation.

The passage from the wide-input mode to a narrower mode takes place in the growth zone, moving up.

In the context of the invention, the T-mode adapter structure is thus used as a waveguide.

More specifically, according to the embodiment represented in FIGS. 2 and 3, a mode adapter is provided at the input and output of the optical amplifier OA and at the input of the photodetector D. The mode transfer thus takes place solely at the level of a given function: the optical amplifier (with return at output towards the guide G2 after amplification) or the photodetector D (without return towards the guide since everything has been absorbed).

It will also be noted, on examining FIG. 2, that q input channels are preferably provided, each comprising a guide section G1, a mode adapter T1 (input), an optical amplifier OA, a second mode adapter T2 (output), and an optical guide section G2 upstream of the input diopter DP1. This arrangement makes it possible to adjust the wavelengths of the output comb. In practice, of course, only one input channel will generally be used.

The optical amplifier OA is formed from the abovementioned layers 7, 8 and 9, more specifically by the etching of a strip in the upper layers 8 and 9 and by the deposition of respective metallizations marked 20 and 21 on the accompanying figures, one on the upper layer 19 (doped p), the other on the layer 7 (doped n updated).

Typically, the gap L1 between the metallization 21 on layer 7 and the strip formed in layers 8 and 9 and supplied with metallization 20, is of the order of 4 to 5μm.

As has been shown previously, in order to reduce the dimensions of the device, according to the invention each channel of the wavelength separator filter MUX is preferably constituted of an assembly of guides g1mux to g4mux associated with mirrors M1 to M3 replacing the bends known from the documents by Verbeek and Zirngibl, between the planar diopters DP1 and DP2.

The invention thus makes it possible to use a reduced-size guide grating spectrometer g1mux to g4mux and mirrors M1 to M3 instead of the standard guide grating spectrometer.

Mirrors M1 to M3 are fabricated in layers 1 to 4 used to form the T-mode adapter structures. These T-mode adapter structures, being wide-mode, are structures with a single material InP containing thin layers (less than 0.13μm) of GaInAsP. Thus the homogeneity of the material existing in the mode adapter structures is more propitious to a uniform etching for fabricating mirrors.

Indeed, the binary/quaternary/binary narrow-mode structures (InP/GaInAsP(=0.5μm)/InP) are difficult to etch uniformly.

It is true that mirrors M1 to M3 may induce certain losses due to the lack of uniformity in the etching of the layers. However, the mirrors make it possible to notably reduce the propagation losses by diminishing the size of the devices and consequently the guide lengths.

Mirrors M1 to M3 composing the wavelength separator filter MUX present another advantage compared to standard large-curvature radius bends: they avoid the correction of the guide lengths in function of the curvature of the bends (cf. Verbeek document, page 64, line 16). As Verbeek clearly indicates, the propagation constant (or index) depends on the curvature radius. Thus the difference in length between two successive guides is not constant. It depends on the curvature. By contrast, according to the invention, the separator filter MUX is not composed of bends, but of mirrors, allowing all the circuit guides to have the same propagation constant. In addition, unlike standard bends, the same behavior is retained in TE and TM-mode. This advantage helps reduce time spent on simulation and thus conception.

Different variants of the embodiment may also be applied to the photodetector D.

However, according to the invention, each photodetector D comprises preferably two identical diodes placed side by side and mounted head to tail.

In practice, these two diodes making up each photodetector D may be formed by depositing, on a same substrate, layers constituting a first stack of semiconductor layers constituting a first diode, and a second stack identical to and placed alongside the first stack, this second stack constituting a second diode, means of polarization being connected to the first diode through the second diode, the two diodes thus being mounted head to tail, one being reverse polarized and the other forward polarized.

In practice, the photodetector may comprise two PIN diodes or two INP diodes.

In operation, one of the diodes is reverse polarized and serves as a photodetection means, whereas the other is necessarily forward polarized and serves to carry the photodetection current.

This photodetector structure has the advantage of necessitating a single metallization (and not two as was previously the standard practice) on a single level (and not two as previously).

It will also be noted that, as a result of this photodetector structure consisting of two head-to-tail diodes, each diode may play the role of photodetector (the other diode then ensuring the circulation of the photocurrent). Thus, not just one but two optical guides may be associated with such a structure, these guides passing respectively under the two diodes. By reverse polarizing one diode or the other, it is possible to work with one or the other of the guides.

Should one of the channels become defective, it is always possible to use the other one by transferring the photodetection function to the corresponding diode. This transfer is immediate since all that is required is to switch the polarization direction. The life and reliability of the device are thus increased.

The photocurrent is generated by the part of the photodetector structure which is depleted in charge carriers and reverse polarized. It does not cross the part of the structure directly unless the polarization applied compensates its depletion to voltage V=0. In other words, with a zero polarization, both zones are depleted. When light is switched on, one of the parts of the structure creating the photocurrent will be blocked by the other depleted part. By applying a voltage, one part of the structure is reverse polarized and remains depleted while the other, forward polarized part becomes conductive.

The first diode operating in reverse direction (the generated photocurrent circulates in the blocked direction) thus behaves like a current generator which flows into the second polarized diode in the conducting (direct) direction. Although the structure prevents the external current from passing, the photocurrent may be detected.

Figure 5:
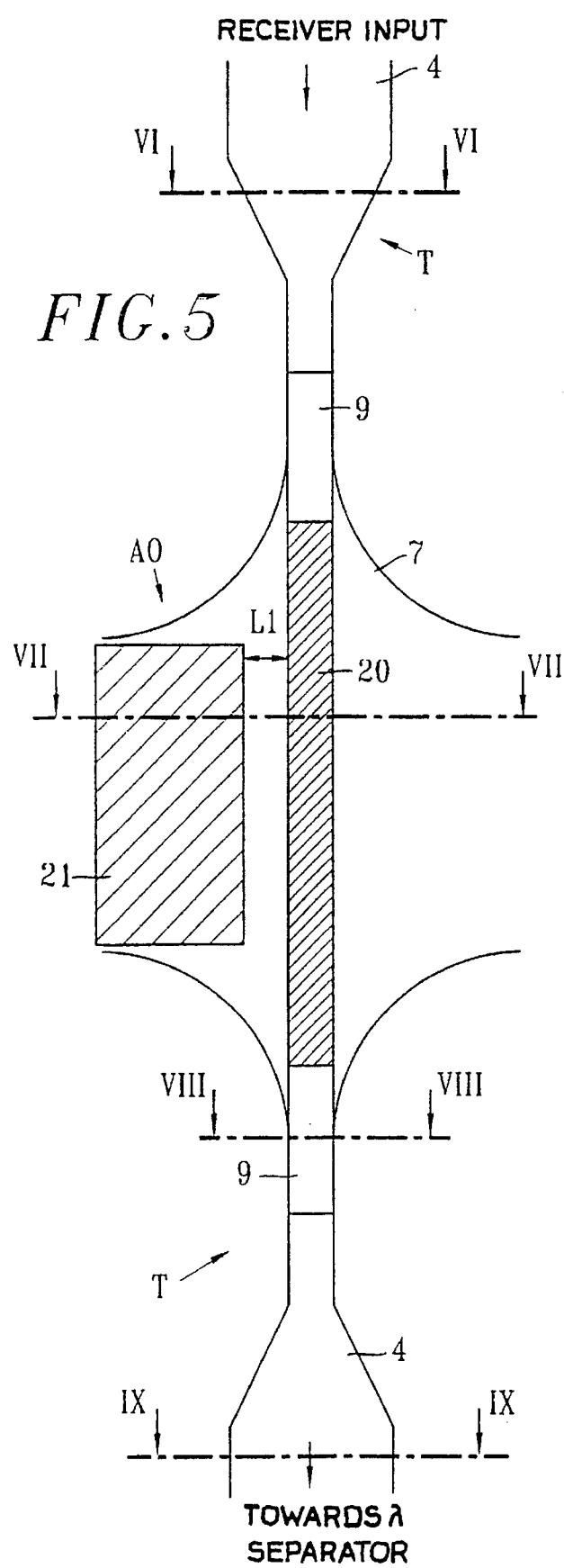
FIG. 5 represents an overhead view, in greater detail, of a wide-mode optical guide and of an optical amplifier according to the invention.
Figure 6:
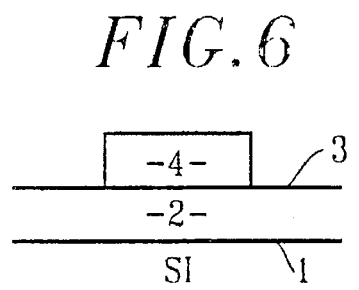
FIGS. 6, 7, 8 and 9 represent cross-sectional views of this same assembly according to sectional planes marked respectively VI, VII, VIII and IX in FIG. 5, and corresponding respectively to a decay zone of a mode adapter, to the optical amplifier, to the groove of a glass-shaped mode adapter and the growth zone of a glass-shaped mode adapter.
Figure 7:
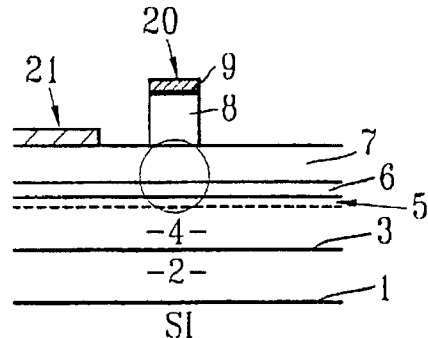
Figure 8:
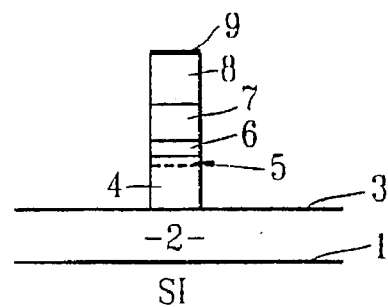
Figure 9:
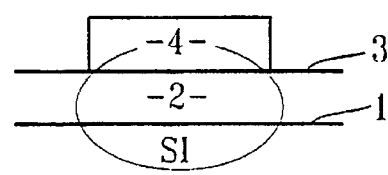
Figure 10:
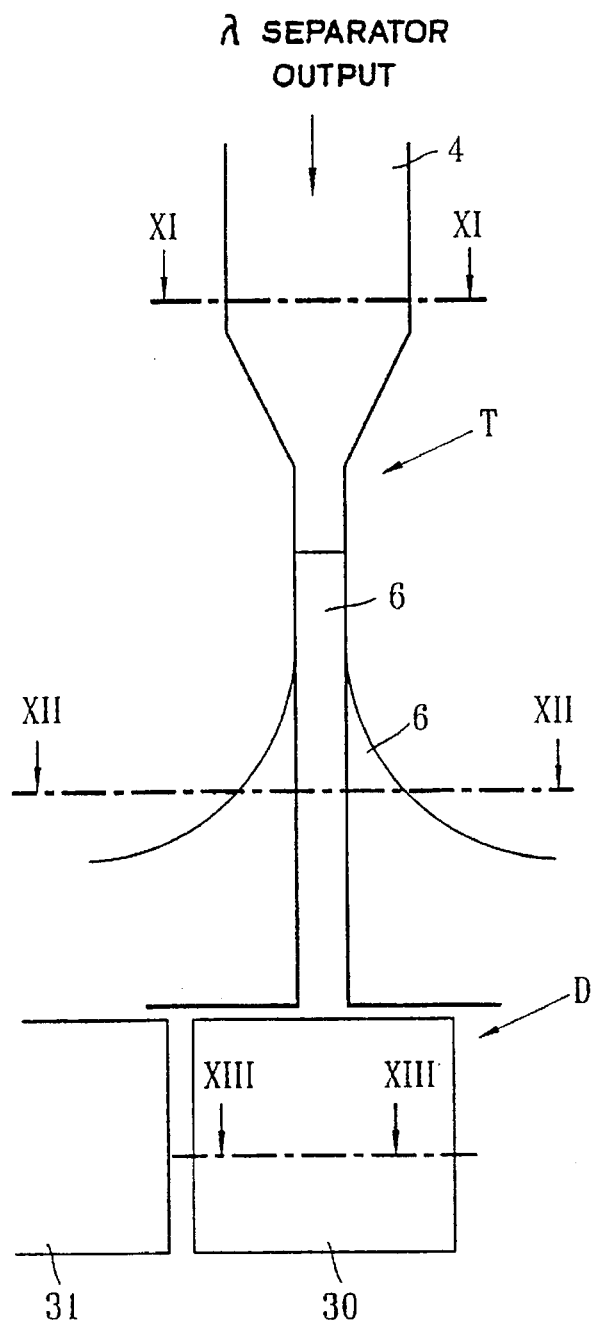
FIG. 10 represents a similar view from above illustrating the integration of a wide-mode guide and a photodetector according to the invention.
Figure 11:
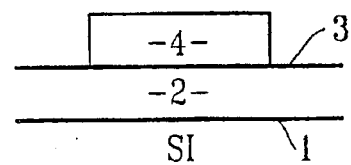
FIGS. 11, 12 and 13 represent cross-sectional views of the same assembly according to sectional planes marked XI, XII and XIII in FIG. 10, and corresponding respectively to an input zone of a mode adapter, to a growth zone of a mode adapter and to the photodetector.
Figure 12:
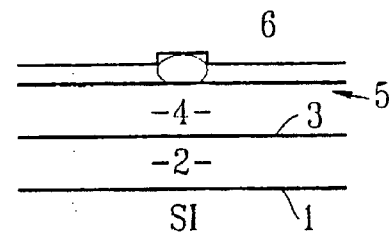
Figure 13:
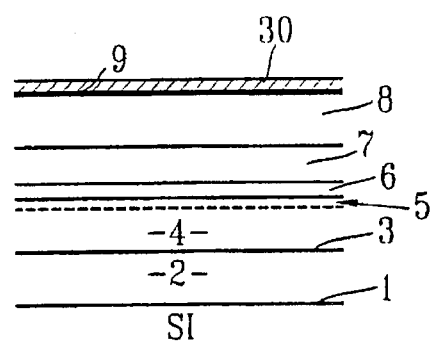
Figure 14:
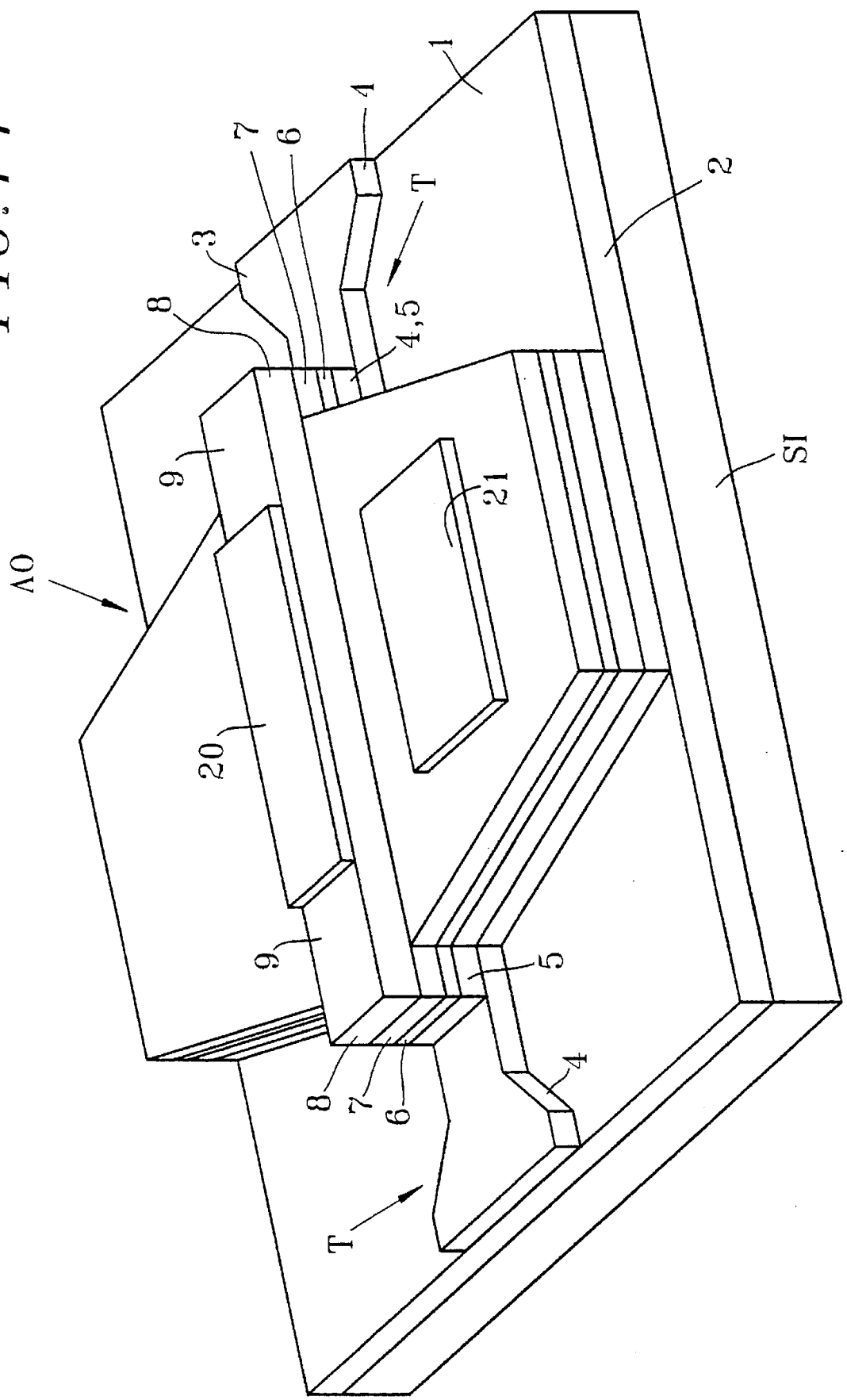
FIGS. 14, 15 and 16 represent schematic perspective views, respectively of the assembly integrating a wide-mode guide and an optical amplifier according to FIG. 5, of the assembly constituting a wavelength separator filter with mirror and of the assembly according to FIG. 10 integrating a wide-mode guide and a photodetector.
Figure 16:
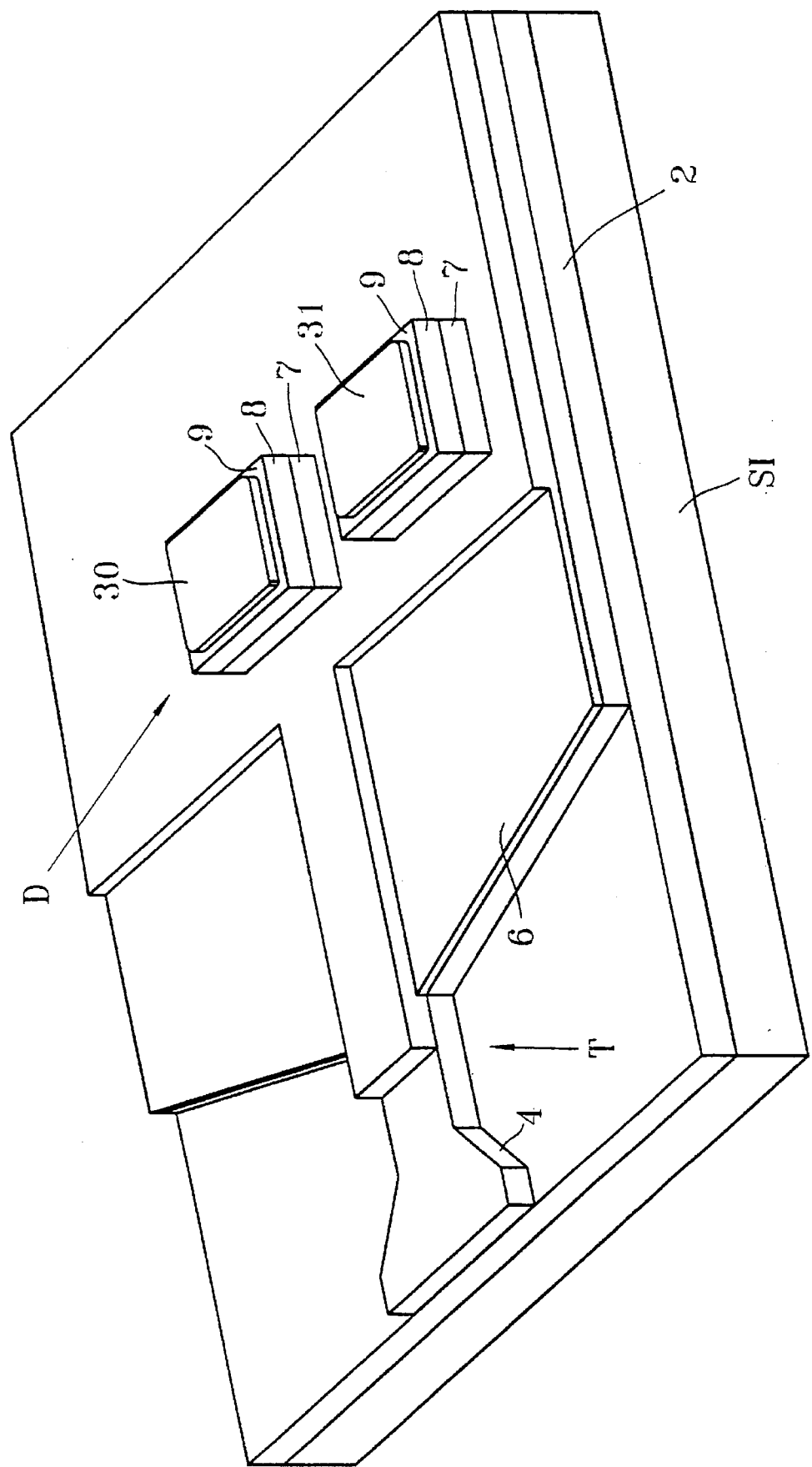

Even more specifically, the structure represented in FIGS. 5 to 16 may be fabricated, after deposition by epitaxy of the nine layers indicated in Table 1 above, through the following stages:

1) deposition of metallization 20 of contact p on the zone of upper layer 9 designed to form the optical amplifier OA (see FIGS. 5, 7 and 14), and deposition of metallizations 30, 31 of contact p on the zones of upper layer 9 designed to form the two stacks constituting the head-to-tail diodes, as illustrated in FIGS. 10, 13 and 16; then fabrication of the strip constituting the optical amplifier OA as illustrated in FIGS. 5, 7 and 14, together with the blocks constituting the stacks of the photodetector structure as illustrated in FIGS. 10, 13 and 16, by etching of layers 8 and 9, with self-alignment on the abovementioned metallizations 20, 30, 31.

More specifically, an optical amplifier OA strip is fabricated for each of the nine input channels, and two longitudinal blocks respectively the two head-to-tail diodes of a photodetector, for each of the output channels.

2) passivation of the blocks and strips constituting the photodetector structure P and the optical amplifiers OA.

3) shrinkage of the absorbent layer 7 around the stacks constituting the photodetector structures P and on the single heterostructure SH made up of layers 5 and 6, of weak mode width, situated upstream of these layers, as may be seen in FIG. 16. Thus the stacks constituting the head-to-tail diodes are made up of layers 7, 8 and 9.

4) Etching of the guide strip constituting guide G3, in layer 6, as may be seen in FIG. 10.

Figure 15:
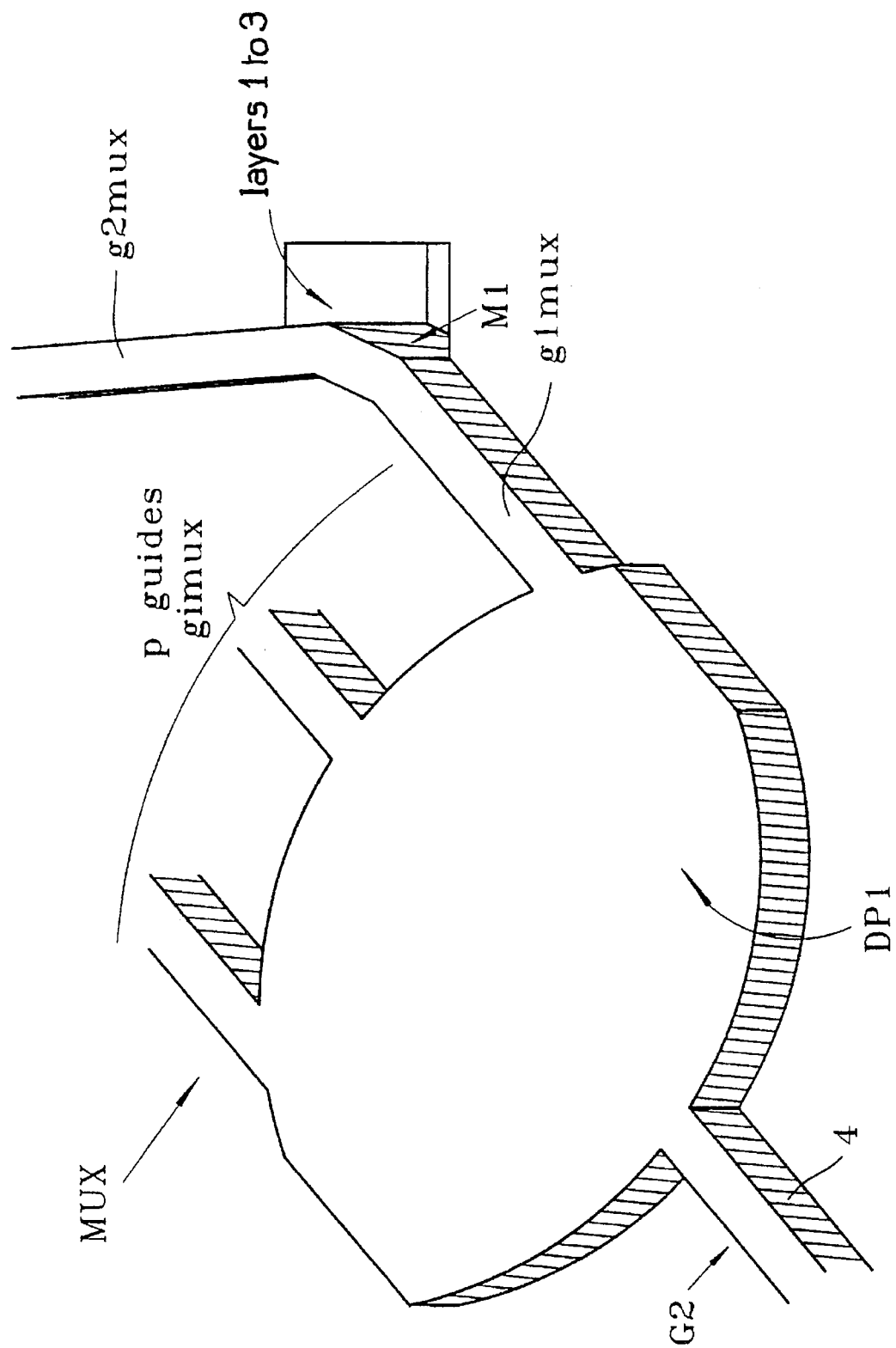

5) deep etching in layer 4, for fabricating glass-shaped mode adapters and wide-mode guides as may be seen in FIGS. 5, 6, 9, 10, 11, 14 and 16, and for fabricating diopters DP1, DP2 and guide sections g1mux of the filter MUX, as illustrated in FIG. 15. Thus diopters DP1, DP2 and guide sections g1mux are fabricated in the binary layer.

6) shrinkage of the small-mode guide layer formed by layer 6 above the wide guides, and 7) Reactive Ion Etching (RIE) as far as the semi-insulating substrate, in layers 1 to 4 for the fabrication of mirrors M1 to M3, as represented schematically in FIG. 15. Thus reflection is induced by the index difference between the air and the semiconductor.

It should be noted that, as a result of the process which has just been described, the integration of the wide-mode guide with the optical amplifier (FIG. 5) and the integration of the wide-mode guides with the detector -FIG. 10) are operated without epitaxy recovery.

This integration, thanks to the use of glass-shaped mode adapters in particular, makes it possible to relax manufacturing tolerances.

In the case of the optical amplifier, the guide structure is made up of an amplifying structure.

In the case of the detector, the guide structure is a single heterostructure.

The absorbent detector layers 7 to 9 are recessed in the mode transition part, in order to avoid realizing a pointed diode with a stronger leakage current.

FIG. 17 shows another alternative embodiment of a photodetector according to the invention, according to which an optical amplifier OA is provided on each of n output channels, just before each photodetector D. These optical amplifiers OA allow separate adjustment of the level of the different signals of given wavelengths. It is thus possible to raise the signal level of wavelength $\lambda_1$ having undergone losses relative to the crossing of the device.

This arrangement also makes it possible to recover only one wavelength in output by applying a current to the optical amplifier on the specific path of signal $\lambda_1$.

In this case, the mode adaptation is preferably used only once on the whole of the circuit, just upstream of the optical amplifier. It allows the passage from the wide-mode guide to the weak-mode optical amplifier OA. The same layers of the optical amplifier OA are used for the photodetector D. The amplifier is forward polarized and the detector reverse polarized.

Thus, FIG. 17 shows q input channels each comprising an optical guide section G1, a wavelength separator filter MUX, comprising an input diopter DP1, an input diopter DP2 and, between these diopters, a network of optical guides g1mux to g4mux associated with mirrors M1 to M3, and n output channels each comprising an optical guide section G3 leading to a T-mode adapter and thence to an optical amplifier OA and a photodetector D.

Figure 19:
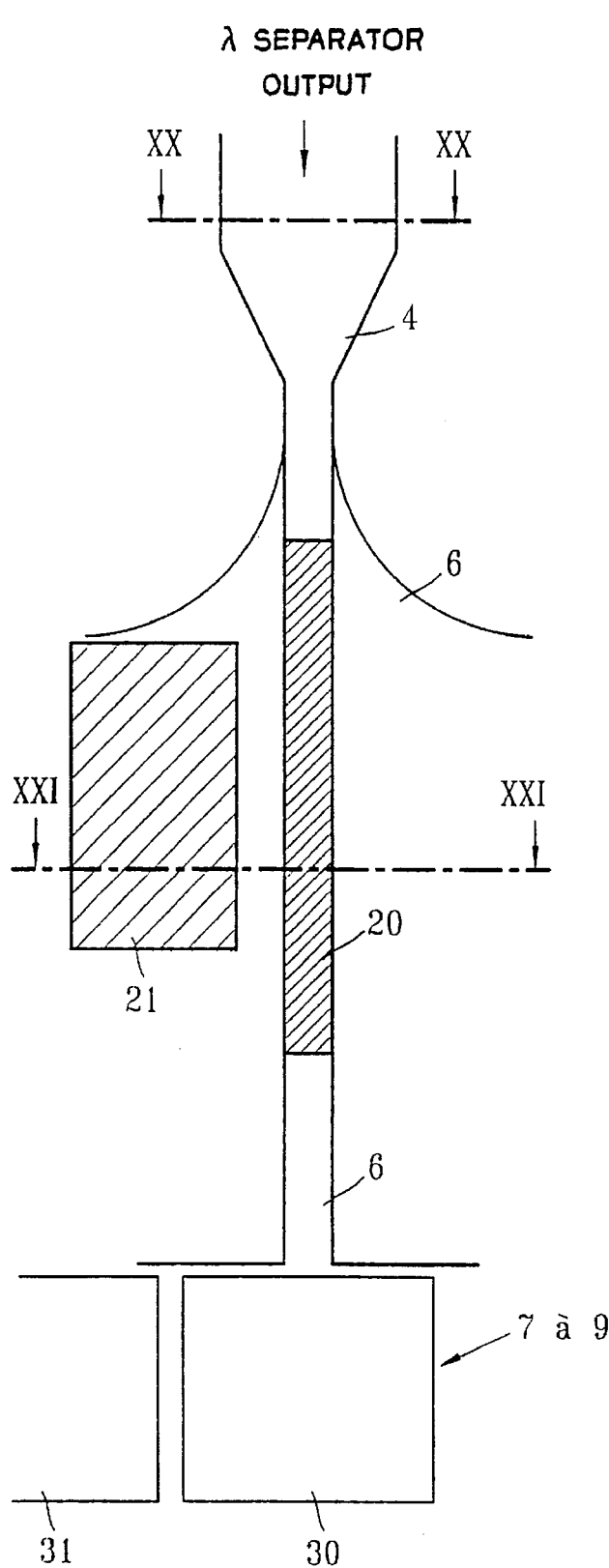
FIG. 19 represents a partial overhead view of the device, according to the invention, represented in FIG. 17, and illustrates with greater precision the integration of a wide-mode guide and an optical amplifier associated with a photodetector.
Figure 20:
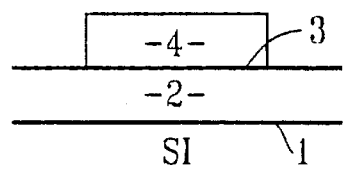
FIGS. 20 and 21 represent cross-sectional views of the same assembly according to the sectional planes marked XX and XXI in FIG. 19.
Figure 21:
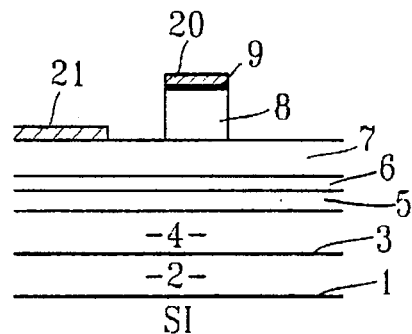

Fabrication details of this structure are given in FIGS. 19 to 21.

This structure consists essentially of the 9 layers mentioned in Table 1, deposited by epitaxy, and by means of a series of stages comparable to those previously described with respect to FIGS. 5 to 16.

Naturally, this invention is not limited to the particular embodiments described heretofore, but may be extended to include any variant consistent with its spirit.

In particular, the wavelength separator filter may be applied to other variants comprising numbers of optical guide sections and mirrors between diopters DP1 and DP2 which differ from those illustrated in FIGS. 2 and 4.

In addition, the mirror-based wavelength separator filter, considered as preferential in the context of the invention, may be replaced by a network of index-change optical guides, for example a network of parallel rectilinear optical guides presenting different indices from one guide to another.

In the context of the invention, and with a view to operating the required dephasing, it is also possible to envisage combining the mirrors, as illustrated in FIGS. 2 and 4, defining optical paths with different physical lengths, and an index change, from one channel to another, in order to optimize the difference between the optical paths traveled.

This invention presents several advantages compared to the prior art.

Compared to the document by R. Dall'Ara et al., the use recommended according to the invention of a non-absorbent guide (weak mode) as an intermediary between the amplifier and the detector, makes it possible to avoid interface losses.

The monolithic integration of all the circuits making up the optoelectronic device makes it possible in particular to eliminate the problems of alignment between each circuit making up the optoelectronic device, to avoid losses due to connection, and thereby to reduce the cost of the device.

Moreover, the optoelectronic device according to the invention may be obtained without epitaxy recovery. It is also independent of the optical polarization (TE and PM).

The use of glass-shaped mode adapters allows simple integration with less stringent manufacturing tolerances.

The use of a mirror-based wavelength separator filter makes it possible to reduce the size of the device compared with previous vertical grating spectrograph and/or waveguide grating spectrograph solutions.

The invention also allows the reduction of propagation losses by reducing the size of the device.

Naturally, the invention may be applied to numerous variants. As a non-limitative example, mention may be made of an embodiment consisting of a wavelength separator filter comprising a demultiplexer containing 74 channels muxn, a number of 8 channels at the input of the device and a number of 8 channels at the output.

I claim:

1. An optoelectronic device for separating optical signals of different wavelengths arriving from a similar input comprising:
   at least one input channel comprising a first wide-mode guide which leads to an optical amplifier,
   a first mode adapter provided upstream from said optical amplifier on said first wide-mode guide, a second mode adapter provided downstream from said optical amplifier and which leads to a second wide-mode guide, and
   at least one wavelength separator filter capable of separating different wavelengths of a signal, said filter being connected to an output of said second wide-mode guide and comprising two diopters and a series of guides placed facing respective mirrors between the diopters to define optical paths of different lengths, and at least one output channel comprising a guide leading by way of a third mode adapter from the filter to at least one photodetector,
   wherein said input channel, said first mode adapter, and said wavelength separator are integrated by deposition in a single epitaxy on a semi-insulating substrate.

2. The device of claim 1 wherein the wavelength separator filter is fabricated on a structure forming a mode adapter.

3. The device of claim 1 wherein the wavelength separator filter is made in a single binary material containing thin layers of quaternary material.

4. The device of claim 3, wherein the wavelength separator filter is fabricated in a structure based on InP containing thin GaInAsP layers.

5. The device of claim 1 wherein the wavelength separator filter is formed of four optical guide sections associated with three mirrors.

6. The device of claim 1 wherein the wavelength separator filter comprises five optical guide sections associated with four mirrors.

7. The device of claim 1 wherein a mode adapter is formed by glass-shaped etching.

8. The device of claim 7, wherein the glass-shaped mode adapter comprises a wide-mode input part, a zone of decreasing width to push the mode in depth, and a zone of increasing width allowing the transfer of the wide mode towards a straight mode, or vice versa.

9. The device of claim 8, wherein the glass-shaped mode adapter comprises a groove of non-zero width.

10. The device of claim 8, wherein the mode adapter comprises thin layers in order to dilute the mode.

11. The device of claim 1, wherein said device is fabricated by etchings in a structure deposited by means of a single epitaxy and comprising first layers constituting a diluted-structure wide-mode guide, second layers forming a single heterostructure guide allowing a transition from wide mode to narrow mode and vice versa, and third layers allowing both amplification and detection by inversion of electric polarization.

12. The device of claim 1 wherein the device comprises a doped layer n above a guide structure, in order to allow contact of the photodetector (P) and the optical amplifier (OA).

13. The device of claim 1 wherein the optical amplifier is fabricated from two superimposed layers of semiconductive material, and fabrication of a strip by etching in the upper layer.

14. The device of claim 1 wherein the photodetector is constituted by a first stack of semiconductive layers constituting a first diode, and a second stack, identical to and placed alongside the first stack, this second stack constituting a second diode, and polarization means linked to the first diode through the second diode, the two diodes being thus mounted head to tail, one being reverse polarized and the other forward polarized.

15. The device of claim 1 wherein the wavelength separator filter comprises different optical guide channels presenting optical paths of different length by index change.

16. An optoelectronic device for separating optical signals of different wavelengths arriving from the same input, comprising:
   at least one input channel including a first optical guide,
   at least one wavelength separator filter capable of separating different wavelengths of a signal, said filter being connected to an output of said first optical guide and including two diopters and a series of guides placed facing respective mirrors between the diopters to define optical paths of different lengths, and
   at least one output channel including a second optical guide leading via a mode adapter from an output of said filter to an optical amplifier and a photodetector connected to the output of said optical amplifier,
   wherein said input channel, said wavelength separator, and said output channel are integrated by deposition in a single epitaxy on a semi-insulating substrate.

17. The device of claim 16, further comprising a plurality of output channels connected to the output of said filter, each output channel including a second optical guide leading via a mode adapter to an optical amplifier and a photodetector connected to the output of said optical amplifier.

18. The device of claim 16, wherein the wavelength separator filter is fabricated on a structure forming a mode adapter.

19. The device of claim 16, wherein the wavelength separator filter is made in a single binary material containing thin layers of quaternary material.

20. The device of claim 16, wherein the wavelength separator filter is fabricated in a structure based on InP containing thin GaInAsP layers.

21. The device of claim 16, wherein the wavelength separator filter is formed of four optical guide sections associated with three mirrors.

22. The device of claim 16, wherein the wavelength separator filter comprises five optical guide sections associated with four mirrors.

23. The device of claim 16, wherein the mode adapter is formed by glass-shaped etching.

24. The device of claim 23, wherein the glass-shaped mode adapter includes a wide-mode input part, a zone of decreasing width to push the mode in depth and a zone of increasing width allowing the transfer of the wide mode towards a straight mode, or vice versa.

25. The device of claim 24, wherein the glass-shaped mode adapter includes a groove of non-zero width.

26. The device of claim 24, wherein the mode adapter comprises thin layers in order to dilute the mode.

27. The device of claim 24, wherein the guide is a wide-mode guide.

28. The device of claim 16, wherein said device is fabricated by etchings in a structure deposited by means of a single epitaxy and including first layers constituting a diluted-structure wide-mode guide, second layers forming a single heterostructure guide allowing a transition from wide mode to narrow mode and vice versa, and third layers allowing both amplification and detection by inversion of electric polarization.

29. The device of claim 16, wherein said device includes a doped layer n above a guide structure, in order to allow contact of the photodetector and the optical amplifier.

30. The device of claim 16, wherein the optical amplifier is fabricated from two superimposed layers of semiconductive material, and fabrication of a strip by etching in the upper layer.

31. The device of claim 16, wherein the photodetector is constituted by first stack of semiconductive layers constituting a first diode, and a second stack, identical to and placed alongside the first stack, this second stack constituting a second diode, and polarization means linked to the first diode through the second diode, the two diodes being thus mounted head to tail, one being reverse polarized and the other forward polarized.

32. The device of claim 16, wherein the wavelength separator filter includes different optical guide channels presenting optical paths of different length by index change.

33. A filter integrated by deposition in a single epitaxy on a semi-insulating substrate, for separating different wavelengths of a signal, comprising two diopters and a series of guides placed facing respective mirrors between the diopters to define optical paths of different lengths.

34. The filter of claim 33, wherein the filter is fabricated on a structure forming a mode adapter.

35. The filter of claim 33, wherein the filter is made in a single binary material containing thin layers of quaternary material.

36. The filter of claim 35, wherein the filter is fabricated in a structure based on InP containing thin GaInAsP layers.

37. The filter of claim 33, wherein the filter is formed of four optical guide sections associated with three mirrors.

38. The filter of claim 33, wherein the filter comprises five optical guide sections associated with four mirrors.

* * * * *